US009742194B2

(12) United States Patent
Orr et al.

(10) Patent No.: US 9,742,194 B2
(45) Date of Patent: Aug. 22, 2017

(54) PHOTOVOLTAIC POWER SYSTEM INVERTER DETECTION

(71) Applicant: SOLANTRO SEMICONDUCTOR CORP., Ottawa, Ontario (CA)

(72) Inventors: Raymond Kenneth Orr, Kanata (CA); Kadir Yilmaz, Toronto (CA)

(73) Assignee: Solantro Semiconductor Corp. (CA)

( * ) Notice: Subject to any disclaimer, the term of this patent is extended or adjusted under 35 U.S.C. 154(b) by 287 days.

(21) Appl. No.: 14/707,119

(22) Filed: May 8, 2015

(65) Prior Publication Data
US 2016/0329715 A1 Nov. 10, 2016

(51) Int. Cl.
| | | |
|---|---|---|
| *H02J 1/10* | (2006.01) |
| *H02J 3/38* | (2006.01) |
| *G01R 31/02* | (2006.01) |
| *H02M 7/42* | (2006.01) |
| *H02S 50/00* | (2014.01) |
| *H02M 1/32* | (2007.01) |

(52) U.S. Cl.
CPC ............ *H02J 3/383* (2013.01); *G01R 31/026* (2013.01); *H02M 7/42* (2013.01); *H02S 50/00* (2013.01); *H02M 2001/325* (2013.01); *Y02B 10/14* (2013.01); *Y02E 10/563* (2013.01)

(58) Field of Classification Search
CPC ........ H02J 3/383; G01R 31/026; H02S 50/00; H02M 2001/325; H02M 7/42
USPC .......................................................... 307/43
See application file for complete search history.

(56) References Cited

U.S. PATENT DOCUMENTS

| | | | | |
|---|---|---|---|---|
| 6,705,441 | B1 * | 3/2004 | Boys ....................... | H02J 5/005 191/10 |
| 7,710,751 | B2 * | 5/2010 | Nishino .................. | B60L 5/005 363/125 |
| 8,760,113 | B2 * | 6/2014 | Keating .................... | H02J 7/02 320/108 |
| 2004/0130915 | A1 * | 7/2004 | Baarman ................... | A61L 2/10 363/21.02 |
| 2004/0145342 | A1 * | 7/2004 | Lyon ....................... | H02J 7/025 320/108 |
| 2010/0036773 | A1 * | 2/2010 | Bennett .............. | G06Q 20/3674 705/67 |

(Continued)

OTHER PUBLICATIONS

U.S. Appl. No. 14/611,968, filed Feb. 2, 2015.

*Primary Examiner* — Jared Fureman
*Assistant Examiner* — Duc M Pham
(74) *Attorney, Agent, or Firm* — Barnes & Thornburg, LLP

(57) ABSTRACT

Photovoltaic power system inverter detection apparatus and methods are disclosed. Electrical continuity between an inverter in a PV power system and a PV panel disconnect switch, which switchably couples one or more DC PV panels to the PV power system, is tested while the PV panel disconnect switch is open. A state of the electrical continuity is determined based on measurements of an electrical parameter after the test signal is applied. The PV panel disconnect switch is maintained open on determining no electrical continuity, and closed on determining that there is electrical continuity between the PV panel disconnect switch and the inverter. A shutdown device that implements inverter detection may be located and/or adapted to meet safety conditions, by being located less than 10 feet from the PV panel array and/or adapted to limit a test signal to a maximum of 30V and 240VA.

20 Claims, 9 Drawing Sheets

(56) References Cited

U.S. PATENT DOCUMENTS

2011/0133569 A1\* 6/2011 Cheon .................... H02J 17/00
307/104

\* cited by examiner

PHOTOVOLTAIC POWER SYSTEM INVERTER DETECTION

TECHNICAL FIELD

The embodiments herein generally relate to photovoltaic (PV) panels and PV power systems, and more particularly to controlling connection of PV panels to inverters in PV power systems.

BACKGROUND

PV solar panels are an important source of electrical power. Arrays of PV panels ranging in size from tens of panels to tens of thousands of PV panels are increasingly common. A typical PV panel is organized as a series connection of individual PV cells. A common configuration is 72 PV cells per panel. A typical PV cell operating voltage under full illumination is approximately 0.7 V. An illuminated PV panel with 72 Direct Current (DC) PV cells will therefore have an output voltage of approximately 50 volts DC. PV panels are typically serially connected to form a "panel string". In a DC PV panel system, the output of the panel string could connect to an inverter which converts the DC power of the PV panels into Alternating Current (AC) power suitable for an electrical grid. Typically, there are between five and twenty PV panels in a panel string producing a combined string voltage in the hundreds of volts.

PV panels produce power whenever they are illuminated. As described above, the voltages on a panel string could reach hazardous levels and constitute a safety hazard since the PV panels continue to generate voltage even when the PV system is disconnected from the electrical grid.

SUMMARY

An apparatus according to an aspect of the present disclosure includes: a PV panel disconnect switch to switchably couple one or more DC PV panels to a PV power system; continuity testing circuitry, operatively coupled to the PV panel disconnect switch and to the PV power system, to enable testing of electrical continuity between the PV panel disconnect switch and an inverter in the PV power system; and a controller, operatively coupled to the PV panel disconnect switch and to the connectivity testing circuitry, to control the PV panel disconnect switch to open responsive to occurrence of a disconnect condition, to control the continuity testing circuitry to test electrical continuity between the PV panel disconnect switch and the inverter with the PV panel disconnect switch open, to maintain the PV panel disconnect switch open on determining no electrical continuity, and to control the PV panel disconnect switch to close on determining that there is electrical continuity between the PV panel disconnect switch and the inverter.

In an embodiment, the PV panel disconnect switch is coupled to a single DC PV panel in a PV panel array. In another embodiment, the PV panel disconnect switch is coupled to a panel string that includes multiple serially connected DC PV panels in a PV panel array. In either case, the apparatus is located less than 10 feet from the PV panel array in an embodiment.

The controller could be coupled to control the continuity testing circuitry to test electrical continuity within a maximum of 30V and 240VA.

According to another aspect, an apparatus includes: a PV panel disconnect switch to switchably couple one or more DC PV panels to a PV power system; continuity testing circuitry, operatively coupled to the PV panel disconnect switch and to the PV power system, to enable testing of electrical continuity between the PV panel disconnect switch and an inverter in the PV power system, the continuity testing circuitry including a test signal source; and a controller, operatively coupled to the PV panel disconnect switch and to the connectivity testing circuitry, to control the continuity testing circuitry to apply a test signal from the test signal source to the PV power system with the PV panel disconnect switch open, and to determine a state of electrical continuity between the PV panel disconnect switch and the inverter based on measurements of an electrical parameter in the continuity testing circuitry after the test signal is applied.

The controller, in an embodiment, is further operable to maintain the PV panel disconnect switch open on determining no electrical continuity, and to control the PV panel disconnect switch to close on determining that there is electrical continuity between the PV panel disconnect switch and the inverter.

In an embodiment, the apparatus includes output terminals to couple the apparatus to the PV power system, the test signal source includes a DC test signal source, and the continuity testing circuitry includes: output capacitance coupled across the output terminals, the DC test signal source and a charging switch coupled in a first circuit path across the output terminals, and a discharge resistance and a discharge switch coupled in a second circuit path across the output terminals.

The continuity testing circuitry could also include a diode coupled across the output capacitance.

In another embodiment, the apparatus includes output terminals to couple the apparatus to the PV power system as noted above, the test signal source includes an AC test signal source, and the continuity testing circuitry includes: output capacitance coupled across the output terminals, the AC test signal source and a test switch coupled in a circuit path across the output terminals, and a discharge resistance coupled across the output terminals.

The electrical parameter could be one or both of: voltage and current.

The test signal has a voltage lower than a predetermined maximum voltage that is compliant with a safety standard, in an embodiment.

The test signal is within a maximum of 30V and 240VA, in an embodiment.

The test signal source could be powered by the one or more DC PV panels while the disconnect switch is open.

The apparatus of claim 5, wherein the PV panel disconnect switch is coupled to a single DC PV panel in a PV panel array, and wherein the apparatus is located less than 10 feet from the PV panel array.

As noted above, the PV panel disconnect switch could be coupled to a single DC PV panel in a PV panel array or to a panel string that includes multiple serially connected DC PV panels in a PV panel array, with the apparatus being located less than 10 feet from the PV panel array in an embodiment.

The controller could be operable to determine the state of electrical continuity between the PV panel disconnect switch and the inverter based on measurements of voltage across the output terminals at respective different times after the test signal is applied.

The controller could also or instead be operable to determine the state of electrical continuity between the PV panel disconnect switch and the inverter based on an impedance determined from voltage across the output terminals and current flow in a circuit path between the output terminals while the test signal is applied.

A method according to a further aspect includes: applying a test signal from a test signal source to test electrical continuity between a PV panel disconnect switch that is open and disconnects one or more DC PV panels from a PV power system, and an inverter in the PV power system; obtaining measurements of an electrical parameter, at a shutdown device that comprises the PV panel disconnect switch, after the test signal is applied; and determining a state of electrical continuity between the PV panel disconnect switch and the inverter based on the measurements.

The applying could involve applying a DC signal as the test signal, in which case the obtaining could involve obtaining measurements of voltage, across output terminals at which the shutdown device is coupled to the PV power system, at respective different times after the test signal is applied.

In an embodiment, the applying involves applying an AC signal as the test signal, and the obtaining involves obtaining measurements of one or both of: voltage, across output terminals at which the shutdown device is coupled to the PV power system, and current flow in a circuit path between the output terminals, while the test signal is applied, and the determining involves determining the state of electrical continuity between the PV panel disconnect switch and the inverter based on an impedance determined from the voltage and the current.

DETAILED DESCRIPTION

Figure 1:
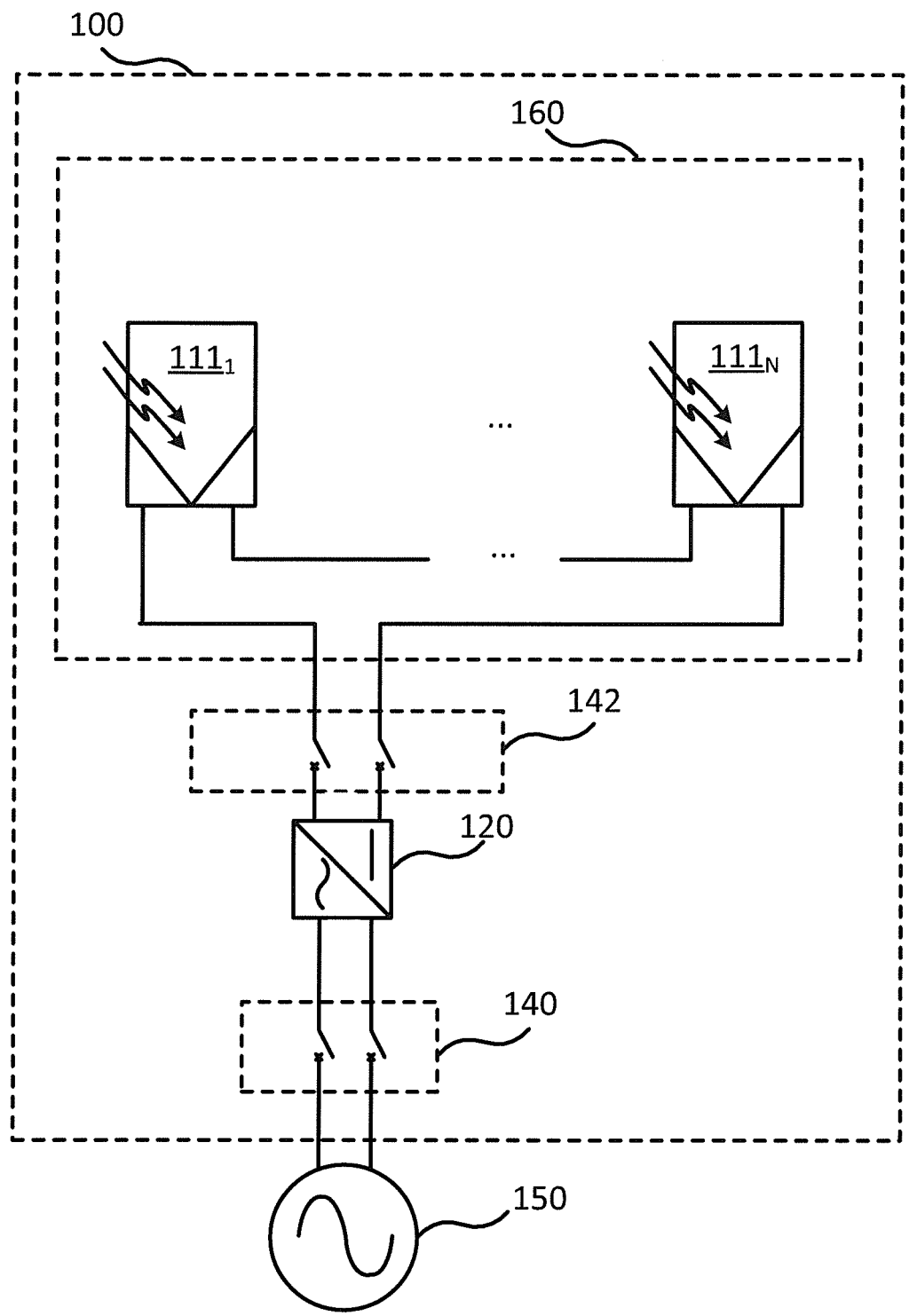
FIG. 1 is a block diagram of an example grid tied PV installation.

FIG. 1 is a block diagram of an example grid tied PV installation 100. PV installation 100 comprises panel string 160, DC disconnect switch 142, inverter 120 and grid disconnect switch 140. Panel string 160 comprises DC PV panels $111_1, \ldots 111_N$ which are serially coupled together. Panel string 160 operatively connects to the input of inverter 120 through DC disconnect switch 142. The AC output of inverter 120 operatively connects to electrical grid 150 through grid disconnect switch 140. Electrical grid 150 could range in size from a large, nation-wide utility grid to a small scale microgrid such as for a remote location like a mining camp. Inverter 120 converts the DC power of panel string 160 to AC power. FIG. 1 is an example only and other arrangements are possible in accordance with the embodiments herein. For example there could be multiple panel strings arranged in parallel and connected to inverter 120 through individual DC disconnect switches. Multiple parallel panel strings could also or instead be connected to inverter 120 through a common DC disconnect switch.

Each of the PV panels $111_1, \ldots 111_N$ could include multiple PV cells, as noted above. Power conductors connecting the PV panels $111_1, \ldots 111_N$ to form the PV string 160 could include cabling and connectors, for example, rated to handle expected string currents and voltages. Any of various types of power switches or circuit breakers, for example, could be used to implement the DC disconnect switch 142 and the grid disconnect switch 140. Similarly, any of various topologies of DC-AC converters could be used to implement the inverter 120.

Power production by a panel string under illumination can represent a potential safety hazard. It could be desirable for the PV string(s) in a PV installation to isolate themselves from their inverter when a string disconnect condition occurs.

A string disconnect condition could occur, for example, when the PV installation is disconnected from the electrical grid. A PV installation could disconnect from the electrical grid for any of a number of reasons. These could include, for example: a deliberate disconnection for servicing or maintenance purposes; an automatic disconnect in the event of a fault in a PV installation component such as for example, an inverter; an automatic disconnect due to an electrical fault on the electrical grid. A PV installation could also be disconnected from the grid prior to its commissioning. In the case of a building mounted PV installation in which the PV panels could be mounted on the building, or Building Integrated PV (BIPV) installations in which the PV panels are integrated into, for example, the building roof or walls, the PV installation could be deliberately disconnected from the electrical grid in the event of an emergency such as a fire in the building.

A string disconnect condition could also occur, for example, in the event of an open circuit or high resistance condition in the panel string itself. This might be caused by, for example: a physical break in the panel string; removal of one or more PV panels from the panel string for maintenance, repair, or replacement; theft of a PV panel, disconnection of the panel string from an inverter for inverter repair or replacement by opening of a disconnect switch; and/or during initial PV panel installation before all PV panels are installed in a panel string.

A string disconnect condition could also occur in the event of a failure, malfunction or shut down of the inverter.

A string disconnect condition could also occur on loss of power production from the PV panel string. Power production could be lost due to damage to the panels or a loss of illumination.

A string disconnect could be mandatory under some electrical safety codes. For example, the 2014 United States National Electrical Code (NEC 2014) requires that conductors associated with a PV system, whether AC or DC, be able to be de-energized on demand, so that any portion of the conductors that remain energized do not extend more than 10 feet from the PV array or more than 5 feet within a building. As explained in the NEC 2014 Handbook: "First responders must contend with elements of a PV system that remain energized after the service disconnect is opened. This rapid-shutdown requirement provides a zone outside of which the potential for shock hazard has been mitigated. Conductors more than 5 feet inside a building or more than 10 feet from an array will be limited to a maximum of 30 V and 240 VA within 10 seconds of shutdown."

Figure 2A:
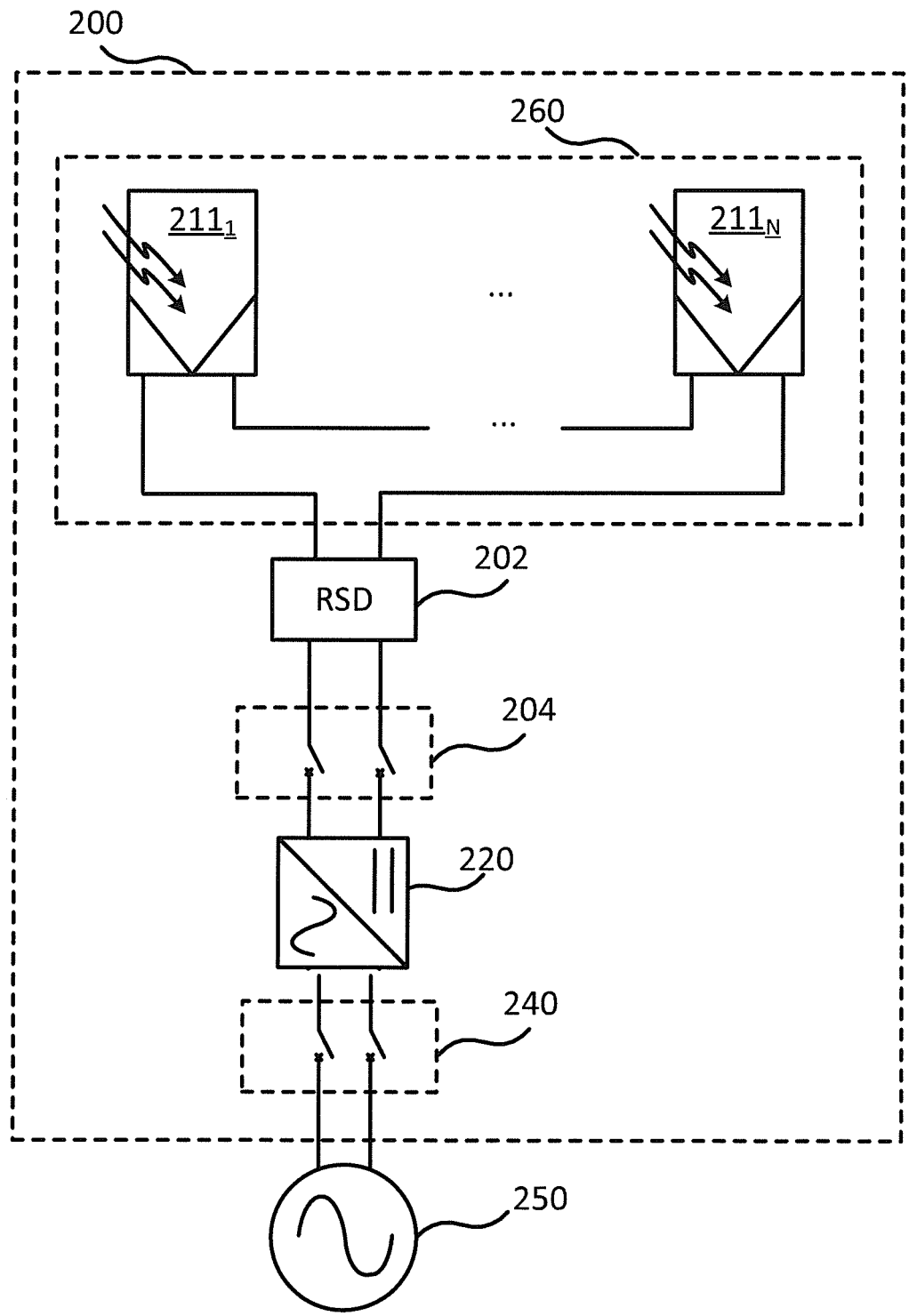
FIG. 2A is a block diagram of another example grid tied PV installation.

FIG. 2A is a block diagram of another example grid tied PV installation 200 equipped with a Rapid Shutdown Device. PV installation 200 comprises panel string 260, Rapid Shutdown Device (RSD) 202, DC disconnect switch 204, inverter 220, grid disconnect switch 240. Panel string 260 comprises DC PV panels $211_1, \ldots 211_N$.

PV installation 200 in FIG. 2A is similar to PV installation 100 in FIG. 1, and similarly-labelled components in PV installation 200 could be implemented in the same or a similar manner as in PV installation 100. In PV installation 200, however, panel string 260 is operatively coupled to inverter 220 through RSD 202 and DC disconnect switch 204, instead of through just a DC disconnect switch 142 as in PV installation 100.

In one embodiment of PV system 200, RSD 202 is co-located with and less than 10 feet from PV panels $211_1 \ldots 211_N$ while DC disconnect switch 204, inverter 220 and grid disconnect switch 240 are located remotely from and at a greater distance than 10 feet from PV panels $211_1 \ldots 211_N$. For example, PV panels $211_1 \ldots 211_N$ and RSD 202 could be mounted on a building roof while DC disconnect switch 204, inverter 220 and grid disconnect switch 240 are located at ground level adjacent the building. In such an embodiment RSD 202 could satisfy the rapid shut down requirements of NEC 2014 by disconnecting panel string 260 from inverter 220 on the occurrence of a string disconnect condition.

PV system 200 is operatively coupled to electrical grid 250 through grid disconnect switch 240. As noted above in the context of claim 1, electrical grid 250 could range in size from a large, nation-wide utility grid to a small scale microgrid such as for a remote location like a mining camp. FIG. 2A is an example only and other arrangements are possible in accordance with the embodiments herein. For example there could be multiple panel strings arranged in parallel and connected to inverter 220 through individual RSDs, and possibly also individual DC disconnect switches. Multiple parallel panel strings could also be connected to inverter 220 through a common RSD and a common DC disconnect switch.

RSD 202 could perform a disconnect function and disconnect panel string 260 from inverter 220 on the occurrence of a string disconnect condition. To comply with NEC 2014 the distance between RSD 202 and panel string 260 could be less than 10 feet.

In one embodiment, RSD 202 monitors the current in panel string 260 and disconnects panel string 260 when the string current drops below a predetermined threshold value. In one embodiment the predetermined threshold value for a single panel string is 10 mA.

After RSD 202 has disconnected panel string 260 due to a string disconnect condition, it could check to determine whether the string disconnect condition has been resolved and whether the panel string can be safely reconnected to the inverter 220. RSD 202 could check for electrical continuity between its output and the input of inverter 220. If there is no electrical continuity to the input of inverter 220, then this could indicate that DC disconnect switch 204 is open and could also or instead be indicative of one of a number of different unsafe conditions such as, for example: a failure or malfunction of the inverter 220; a deliberate shut down of the inverter for servicing, repair or replacement; an uncommissioned installation; or an emergency such as a fire. Lack of electrical continuity could also indicate an open circuit in the cabling between the RSD 202 and the inverter 220. In the above circumstances it could be unsafe or otherwise undesirable for the RSD 202 to attempt to connect the PV string 260 to the inverter 220. If there is electrical continuity to inverter 220, then this could indicate that DC disconnect switch 204 is closed and that it is safe for RSD 202 to connect panel string 260 to inverter 220.

Figure 2B:
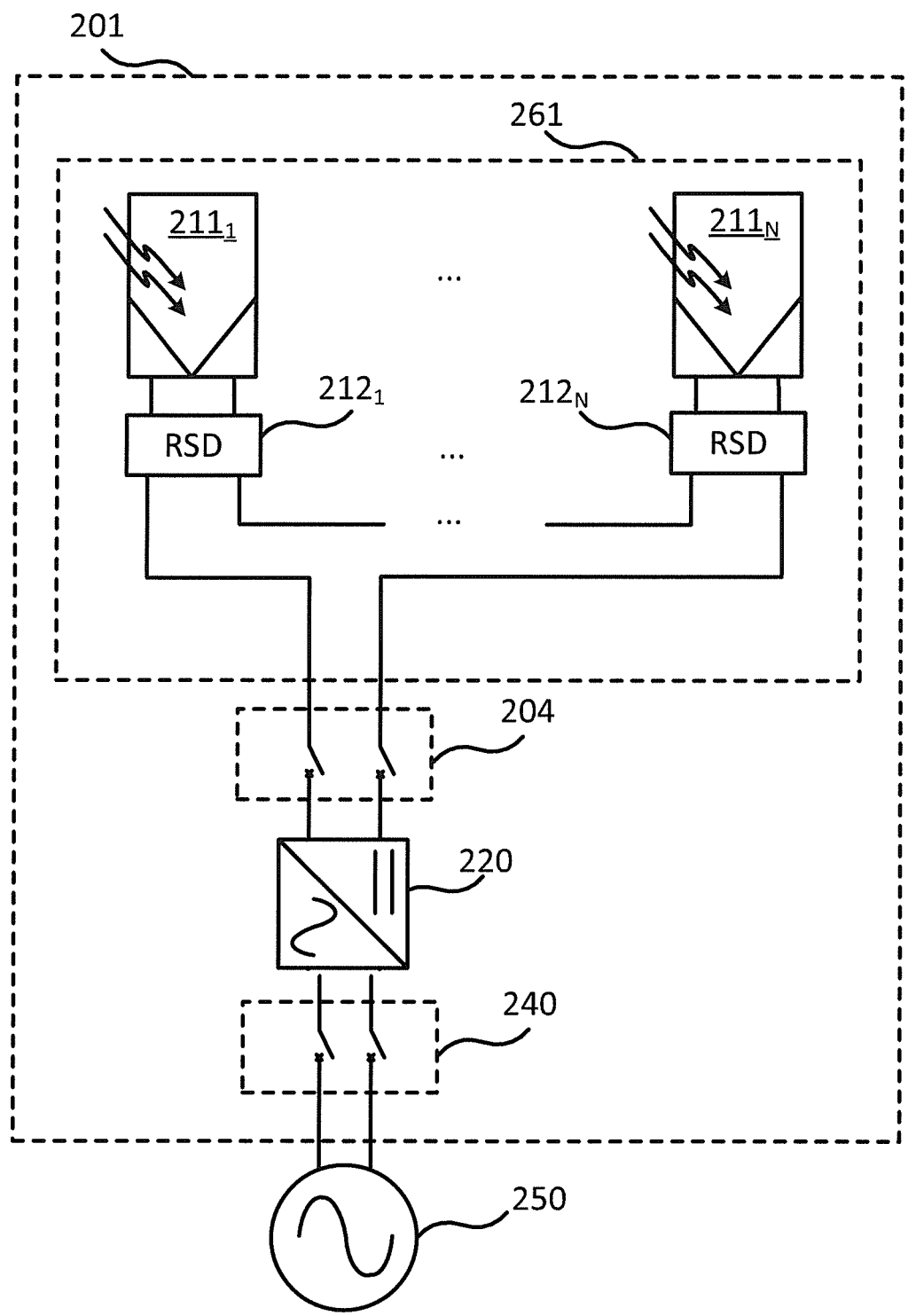
FIG. 2B is a block diagram of a further example grid tied PV installation.

FIG. 2B is a block diagram of another example grid tied PV installation equipped with an RSD. PV installation 201 comprises panel string 261, DC disconnect switch 204, inverter 220, grid disconnect switch 240. Panel string 260 comprises DC PV panels $211_1, \ldots 211_N$ and RSDs $212_1 \ldots$ RSD $212_N$.

PV installation 201 in FIG. 2B is similar to PV installations 100, 200 in FIGS. 1 and 2, and similarly-labelled components in PV installation 201 could be implemented in the same or a similar manner as in PV installation 100 or 200. In PV installation 201, however, PV panels $211_1, \ldots 211_N$ operatively couple to inverter 220 through respective RSDs $212_1 \ldots$ RSD $212_N$ and DC disconnect switch 204.

In one embodiment of PV system 201, RSDs $212_1 \ldots$ RSD $212_N$ are co-located with and less than 10 feet from their respective panels PV panels $211_1 \ldots 211_N$ while DC disconnect switch 204, inverter 220 and grid disconnect switch 240 are located remotely from and at a greater distance than 10 feet from PV panels $211_1 \ldots 211_N$. For example, PV panels $211_1 \ldots 211_N$ and RSDs $212_1 \ldots$ RSD $212_N$ could be mounted on a building roof while DC disconnect switch 204, inverter 220 and grid disconnect switch 240 are located at ground level adjacent the building. In such an embodiment RSDs $212_1 \ldots$ RSD $212_N$ could satisfy the rapid shut down requirements of NEC 2014 by disconnecting PV panels $211_1 \ldots 211_N$ from panel string 261 on the occurrence of a string disconnect condition.

Each RSD $212_1 \ldots 212_N$ may operate in much the same manner as RSD 202 in FIG. 2A, to perform disconnect, electrical continuity check, and reconnect functions, but for respective PV panels $211_1 \ldots 211_N$ instead of the entire panel string 261. In one embodiment, each RSD $212_1 \ldots 212_N$ monitors the current in panel string 261 and disconnects its PV panel $211_1 \ldots 211_N$ from panel string 260 when the string current drops below a predetermined threshold value, illustratively 10 mA in one embodiment. Each RSD $212_1 \ldots 212_N$, after disconnecting its PV panel $211_1 \ldots 211_N$ from panel string 261, could check to determine whether the string disconnect condition has been resolved and whether its PV panel can be safely reconnected to the panel string 261, by checking for electrical continuity between its output and the input of inverter 220. If there is no electrical continuity to the input of inverter 220, then this could indicate that DC disconnect switch 204 is open or that there is an open circuit in the cabling between the RSD $212_1 \ldots 212_N$ and the inverter 220, and could also or instead be indicative of one of a number of different unsafe conditions, examples of which are noted above with reference to FIG. 2A. An RSD $212_1 \ldots 212_N$ could maintain its PV panel $211_1 \ldots 211_N$ in a disconnected state where there is no electrical continuity to inverter 220, and reconnect its PV panel only if there is electrical continuity to the inverter.

Thus, an RSD could include a PV panel disconnect switch, continuity testing circuitry, and a controller.

The PV panel disconnect switch switchably couples one or more PV panels to a PV power system. In FIG. 2A, a PV panel disconnect switch in the RSD 202 would switchably couple multiple PV panels $211_1 \ldots 211_N$ to a PV power system, whereas in FIG. 2B, a panel disconnect switch in each RSD $212_1 \ldots 212_N$ would switchably couple one PV panel $211_1 \ldots 211_N$ to a PV power system.

RSD continuity testing circuitry is operatively coupled to the PV panel disconnect switch and to the PV power system, to enable testing of electrical continuity between the PV panel disconnect switch and an inverter in the PV power system. An RSD controller is operatively coupled to the PV panel disconnect switch and to the connectivity testing circuitry, to control the PV panel disconnect switch to open responsive to occurrence of a disconnect condition, to control the continuity testing circuitry to test electrical continuity between the PV panel disconnect switch and the inverter with the PV panel disconnect switch open, to maintain the PV panel disconnect switch open on determining no electrical continuity, and to control the PV panel disconnect switch to close on determining that there is electrical continuity between the PV panel disconnect switch and the inverter. Examples of disconnect conditions and electrical continuity testing are disclosed herein.

In an embodiment in which the PV panel disconnect switch is coupled to multiple serially connected DC PV panels in a PV panel array as in FIG. 2A for example, or to a single DC PV panel in a PV panel array as in FIG. 2B for example, the RSD could be located less than 10 feet from the PV panel array. Such a restriction on location of an RSD relative to a panel array could be intended to meet a safety condition or limitation, for example.

Another safety condition or limitation could also or instead be addressed by configuring the controller to control the continuity testing circuitry to test electrical continuity within a maximum of 30V and 240VA.

Figure 3A:
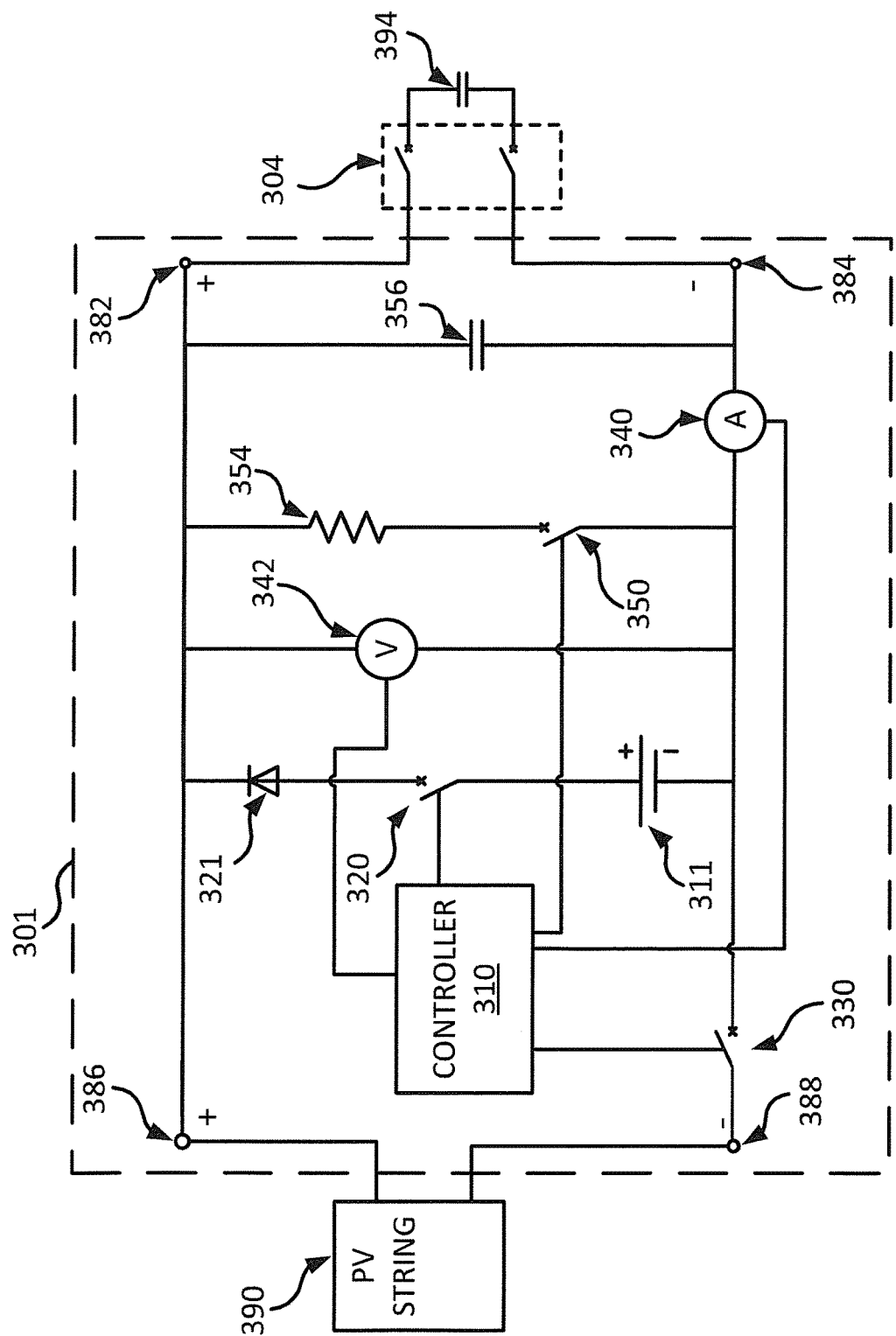
FIG. 3A is a schematic diagram of one embodiment of a Rapid Shutdown Device (RSD)
Figure 3B:
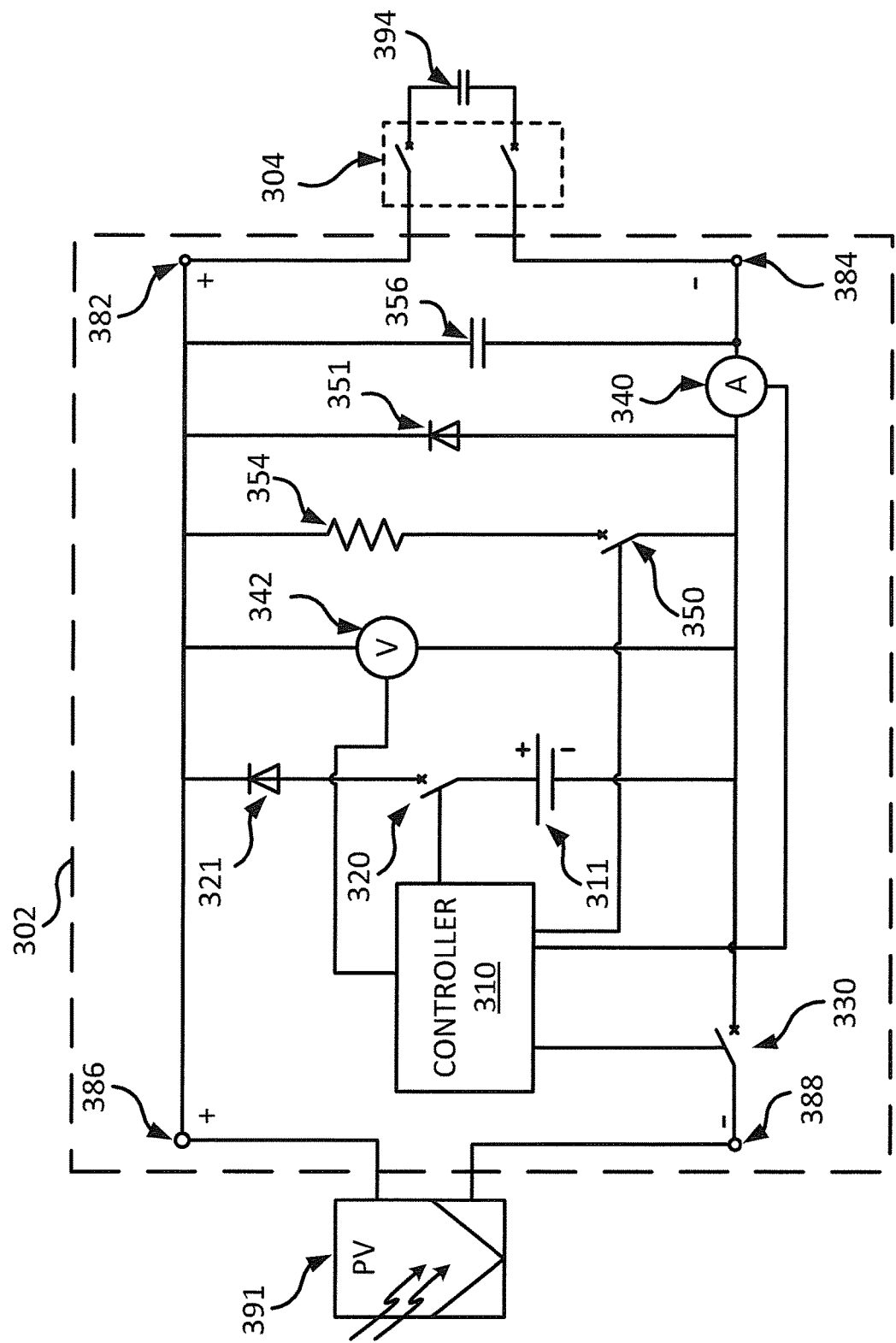
FIG. 3B is a schematic diagram of a further embodiment of an RSD.
Figure 4:
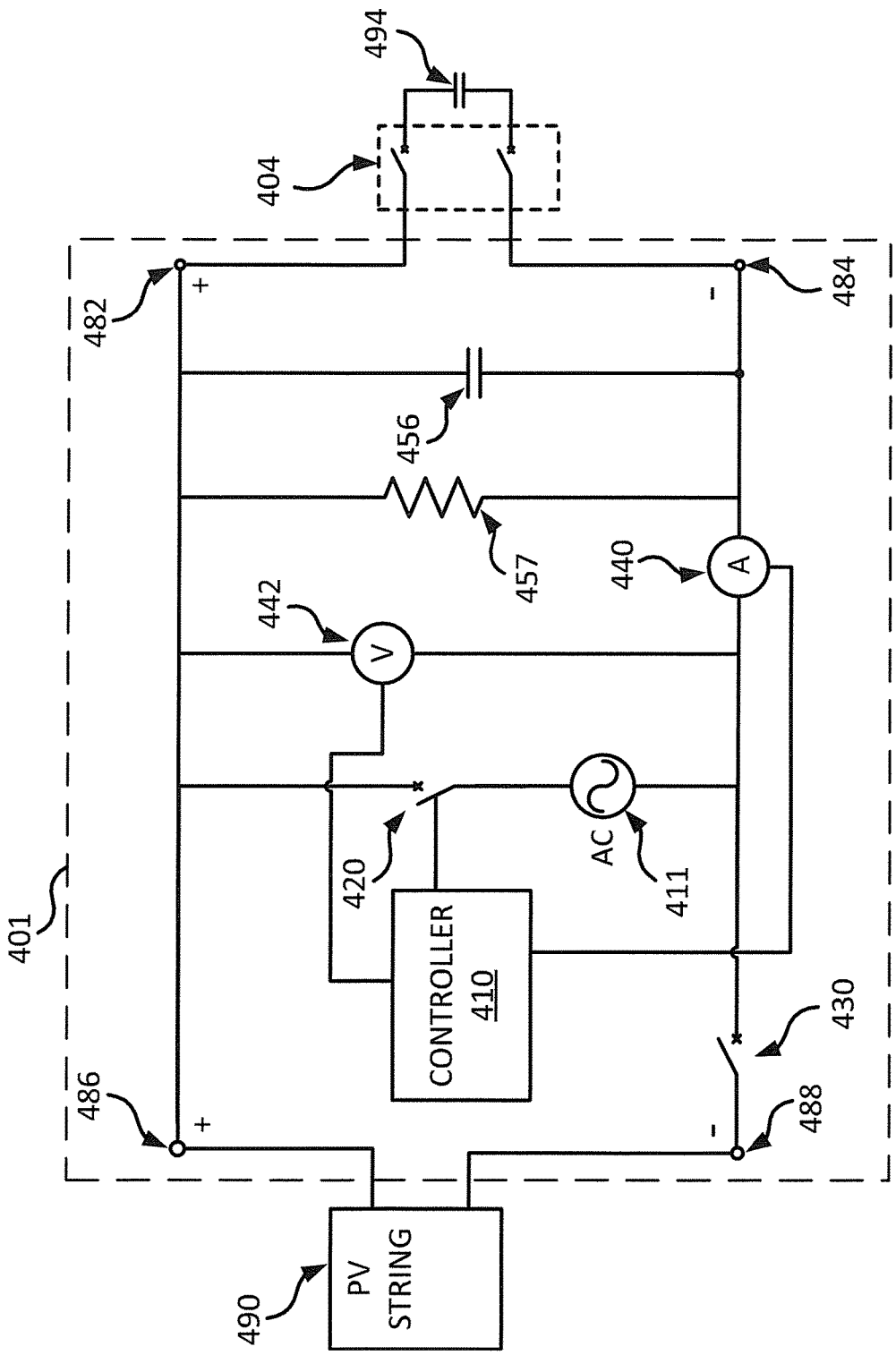
FIG. 4 is a schematic diagram of another embodiment of an RSD.

Detailed examples of RSDs are shown in FIGS. 3A, 3B, and 4, and described below.

FIG. 3A is a schematic diagram of one embodiment of a Rapid Shutdown Device 301. RSD 301 comprises controller 310, DC test source 311, charging switch 320, diode 321, disconnect switch 330, current sensor 340, voltage sensor 342, discharge switch 350, discharge resistance 354, output capacitance 356, output terminal pair 382, 384 and input terminal pair 386, 388. In one embodiment output capacitance 356 has a value of 10 nF and discharge resistance 354 has a value of 120 kOhm. Input terminal pair 386, 388 operatively connects RSD 301 to a PV panel string 390. Output terminal pair 382, 384 operatively connects RSD 301 to one side of DC disconnect switch 304. The other side of DC disconnect switch 304 connects to the input of an inverter (not shown) such as, for example, inverter 220 of FIG. 2A. Capacitance 394 represents the input capacitance of the inverter and is coupled to the other side of DC disconnect switch 304. Capacitance 394 could have a value in the range of 50 µF to 5 mF. Discharge switch 350 couples discharge resistance 354 across output capacitance 356.

Switches 320, 330, 350 could be implemented using any of a variety of means, including but not limited to: power Metal Oxide Semiconductor Field Effect Transistors (MOSFETs), Insulated Gate Bipolar Transistors (IGBTs), thyristors, and/or relays, for example. Controller 310 controls the operation of switches 320, 330, 350. Controller 310 receives current and voltage measurements from current sensor 340 and voltage sensor 342, respectively. Controller 310 could be a single integrated circuit or a collection of components. Controller 310 could be a microcontroller, a Field Programmable Gate Array (FPGA) or an Application Specific Integrated Circuit (ASIC), for example. In one embodiment controller 310 is powered from PV panel string 390.

Current sensor 340 senses current, and could be implemented using an ammeter, for example. Voltage sensor 342 senses the output voltage of RSD 301, and could be implemented using a voltmeter, for example. Although shown as separate from controller 310, in some embodiments current sensor 340 and/or voltage sensor 342, or current/voltage sensing functions, could be incorporated into controller 310.

DC test source 311 supplies a test signal to the input of the inverter (represented by capacitance 394) through charging switch 320 and diode 321. In one embodiment, RSD 301 is coupled to a panel string at 390, and DC test source 311 supplies a test signal having a voltage significantly lower than the string voltage. A low test voltage could substantially improve the safety of operation of the RSD. The test voltage could be chosen to be compliant with electrical safety codes such as NEC 2014. In one embodiment the test voltage is below 30 volts and DC test source 311 is a current limited source to limit charging currents. In one embodiment DC test source 311 receives power from PV panel string 390, but limits testing voltage and current. Although DC test source 311 may be powered by PV panel string 390, the PV panel string remains disconnected from output terminals 382, 384 during continuity testing by maintaining disconnect switch 330 in an open position. DC test source 311 could instead be or include an independent power source.

Diode 321 provides a voltage blocking function and blocks the voltage from PV panel string 390 from test source 311. Diode 321 is not strictly necessary since the blocking function could be provided by charging switch 320. However, the string voltage could be hundreds of volts and diode 321 could allow the use of a low cost charging switch 320 with a voltage rating less than the PV panel string voltage. Thus in some embodiments diode 321 could be absent.

Disconnect switch 330 allows RSD 301 to disconnect PV panel string 390 from the inverter, which is represented in FIG. 3A at 394. In normal operation, disconnect switch 330 is closed, switches 320, 350 are open, and PV panel string 390 provides DC power to the inverter represented at 394, which provides power to an AC grid (not shown).

RSD 301 is an example only and other embodiments are possible. For example, in other embodiments there could be multiple string disconnect switches, including the disconnect switch 330 and a further disconnect switch coupled to the terminal 386 and also controlled by the controller 310, for example.

FIG. 3B is a schematic diagram of another embodiment of an RSD. RSD 302 comprises controller 310, DC test source 311, charging switch 320, diode 321, disconnect switch 330, current sensor 340, voltage sensor 342, discharge switch 350, discharge resistance 354, output capacitance 356, output terminal pair 382, 384, input terminal pair 386, 388 and bypass diode 351. RSD 302 is the same as RSD 301 (FIG. 3A) apart from the bypass diode 351 in RSD 302. Examples of implementations of the other components of RSD 302 are provided above with reference to FIG. 3A.

In operation, RSD 302 could support a panel level rapid shutdown function such as for example, the PV installation with RSDs $212_1 \ldots 212_N$ of FIG. 2B. In this embodiment, input terminal pair 386, 388 could connect RSD 302 to a single PV panel 391 and output terminal pair 382, 384 could connect RSD 302 to a PV panel string as shown in FIG. 2B. Diode 351 allows RSD 302 and PV panel 390 to be bypassed. For example, referring to FIG. 2B, in the event that one of PV panels $211_1 \ldots 211_N$ cannot match the string current of panel string 261, the string current could flow through the bypass diode and prevent a dangerous reverse bias voltage occurring. Bypass diode 351 could also allow any one of RSDs $212_1 \ldots 212_N$ to operatively couple to and determine the state of DC disconnect switch 204, or at least electrical continuity to the inverter represented at 394, even if any of RSDs $212_1 \ldots 212_N$ have disconnected their panels from string 260.

Although the example RSD 301 in FIG. 3A could potentially be used at a PV panel level as shown in FIG. 2B, bypass diode 351 in FIG. 3B could be especially useful for panel-level RSDs in embodiments in which the output capacitance 356 is much smaller than the input capacitance of the inverter at 394, for example. In this case, without bypass diode 351, a test voltage from the test source 311 might not significantly charge the larger inverter input capacitance at 394. For a panel-level RSD embodiment as shown in FIG. 3B, this issue could be compounded since there would be multiple RSDs, each with its own output capacitance, in series between any RSD that is attempting to test continuity and the inverter input capacitance at 394.

FIG. 4 is a schematic diagram of another embodiment of an RSD. RSD 401 comprises controller 410, AC test source 411, test switch 420, disconnect switch 430, current sensor 440, voltage sensor 442, output capacitance 456, bleed resistance 457, output terminal pair 482, 484, and input terminal pair 486, 488. In one embodiment output capacitance 456 has a value of 10 nF and bleed resistance 457 has a value of 10 MOhm. Input terminal pair 486, 488 operatively connects RSD 401 to panel string 490. Output terminal pair 482, 484 operatively connects RSD 401 to one side of DC disconnect switch 404. In another embodiment, input terminal pair 486, 488 could connect RSD 401 to a single PV panel and output terminal pair 482, 484 could connect RSD 401 to a PV panel string as shown in FIG. 2B, and thus 490 could be a single PV panel or a panel string as shown. A panel-level RSD could also include a bypass diode, as shown at 351 in FIG. 3B.

RSD 401 is similar to RSD 301 (FIG. 3A), but includes AC test source 411 instead of DC test source 311 and diode 321, and RSD 401 also includes bleed resistance 457 instead of switched discharge resistance 354 with switch 350. Otherwise, the components shown in FIG. 4 may be implemented in the same or a similar manner as similarly labelled components in FIG. 3A. It should also be noted that bleed resistance 457 could instead be switched as in FIG. 3A, if power dissipation across the bleed resistance during normal operation with disconnect switch 430 closed is of concern.

Bleed resistance 457 discharges output capacitance 456 when disconnect switch 430 and DC disconnect switch 404 are open and could prevent damage to AC test source 411 when switch 420 is closed.

DC disconnect switch 404 connects to the input of an inverter (not shown) such as inverter 220 of FIG. 2A or FIG. 2B. Capacitance 494 represents the input capacitance of the inverter and is coupled to the other side of DC disconnect switch 402. In one embodiment, capacitance 494 has a value ranging from 50 µF to 5 mF.

AC test source 411 supplies an AC test signal to the input of the inverter (represented by capacitance 494) through test switch 420. In one embodiment, RSD 401 is coupled to a panel string at 490, and AC test source 411 supplies a voltage significantly lower than the string voltage. A low test voltage could substantially improve the safety of operation of the RSD 401. The test voltage could be chosen to be compliant with electrical safety codes such as NEC 2014. In one embodiment the test voltage is below 30 volts and AC test source 411 has a power less than 240VA. In one embodiment AC test source 411 receives power from panel string 490, but limits testing voltage and current. Although AC test source 411 may be powered by a PV panel or panel string 490, the PV panel or panel string remains disconnected from output terminals 482, 484 during continuity testing by maintaining disconnect switch 330 in an open position. AC test source 411 could instead be or include an independent power source. In one embodiment AC test source 411 is a voltage source. In another embodiment AC test source 411 is a current source.

FIGS. 3A, 3B, and 4 illustrate detailed examples of RSDs. In a more general sense, an apparatus according to an aspect of the present disclosure includes a PV panel disconnect switch 330, 430 to switchably couple one or more DC PV panels 390, 391, 490 to a PV power system, continuity testing circuitry operatively coupled to the PV panel disconnect switch and to the PV power system, and a controller 310, 410 operatively coupled to the PV panel disconnect switch and to the connectivity testing circuitry.

The continuity testing circuitry enables testing of electrical continuity between the PV panel disconnect switch and an inverter in the PV power system, and includes a test signal source 311, 411. The test signal source 311 is a DC test signal source in FIGS. 3A and 3B, and an AC test signal source 411 in FIG. 4. The continuity testing circuitry also includes output capacitance 356, 456 coupled across output terminals 382/384, 482/484, and a charging switch 320, 420 coupled with the test signal source 311, 411 in a first circuit path across the output terminals. A discharge resistance 354 and a discharge switch 350 are coupled in a second circuit path across the output terminals 382, 384 in the continuity testing circuitry in the example RSDs 301, 302 in FIGS. 3A and 3B. In FIG. 4, a discharge resistance 457 in the continuity testing circuitry is coupled across the output terminals 482, 484. The continuity testing circuitry in the example RSD 302 in FIG. 3B also includes a diode 351 coupled across the output capacitance 356.

The controller 310, 410 is configured to control the continuity testing circuitry to apply a test signal from the test signal source 311, 411 to the PV power system with the PV panel disconnect switch 330, 430 open, and to determine a state of electrical continuity between the PV panel disconnect switch and the inverter at 394, 494 based on measurements of an electrical parameter in the continuity testing circuitry after the test signal is applied. The electrical parameter could include one or both of: voltage and current.

The controller 310, 410 is further operable to maintain the PV panel disconnect switch 330, 430 open on determining no electrical continuity, and to control the PV panel disconnect switch to close on determining that there is electrical continuity between the PV panel disconnect switch and the inverter at 394, 494.

In an embodiment, the test signal has a voltage lower than a predetermined maximum voltage that is compliant with a safety standard, such as a maximum voltage of 30V. The test signal could also or instead be limited to a maximum of 240VA.

The test signal source 311, 411 as shown is not separately coupled to the PV panel or panel string 390, 391, 490. However, in an embodiment, the test signal source is powered by the one or more DC PV panels 390, 391, 490 while the disconnect switch 330, 430 is open. Thus, even though the one or more DC PV panels 390, 391, 490 would be disconnected from the PV power system while the disconnect switch 330, 430 is open, a test signal source that provides a limited test signal could still be powered by the panel(s).

As noted above, a panel disconnect switch could be coupled to a single DC PV panel or multiple DC PV panels in a PV panel array, and an apparatus such as an RSD that incorporates the panel disconnect switch could be located less than 10 feet from the PV panel array.

The state of electrical continuity between the PV panel disconnect switch and the inverter could be determined by the controller 310, 410 in any of several ways. For example, this determination could be based on measurements of voltage across the output terminals 382/384, 482/484 at respective different times after the test signal is applied. In another embodiment, the controller 310, 410 is configured to determine the state of electrical continuity based on an impedance determined from voltage across the output terminals and current flow in a circuit path between the output terminals while the test signal is applied. One or both of the voltage and current could be measured using sensors 340/342, 440/442. As noted above, a voltage value or a current value could be otherwise determined, where the test signal source 311, 411 has a known voltage value or a known current value, for example.

Disconnect Operations

In the event of the occurrence of a disconnect condition, RSD 301, 302, 401 disconnects from PV panel or panel string 390, 391, 490 by opening string disconnect switch 330, 430. A disconnect condition could result in the complete loss of or substantial reduction in the string current. A loss of or reduction in string current could be detected by controller 310, 410 using current sensor 340, 440 and trigger a disconnect of PV panel or panel string 390, 391, 490 from RSD 301, 302, 401 by the opening of disconnect switch 330, 430. In one embodiment, a string current of less than 10 mA is triggers a PV panel or panel string disconnect.

Reconnect Operation

After an RSD has disconnected a PV panel or panel string due to a string disconnect condition, it could check to determine whether the string disconnect condition has been resolved and whether the panel string can be safely reconnected to the inverter. For example, referring to FIG. 2A, after RSD 202 has disconnected panel string 260 and isolated the input of inverter 220 from the string, RSD 202 could check for electrical continuity between its output terminals (e.g. 382, 384 of FIG. 3A or FIG. 3B, or 482, 484 of FIG. 4) and the input of inverter 220. If there is no electrical continuity to the inverter input, then this could indicate that disconnect switch 204 is deliberately open and could also or instead signal one of a number of different unsafe conditions such as, for example: a failure or malfunction of the inverter; a deliberate shut down of the inverter for servicing, repair or replacement; an uncommissioned installation; or an emergency such as a fire. Lack of electrical continuity could also or instead indicate an open circuit in the cabling between the RSD 202 and the inverter 220. In the above circumstances it could be unsafe for the RSD 202 to attempt to connect the PV string 260 to the inverter 220. For example, referring to FIG. 3A, FIG. 3B, and FIG. 4, it could be unsafe to close string disconnect switch 330, 430.

In some cases, it might not be straightforward to detect electrical continuity to the inverter. For instance, in some cases after a string inverter has stopped converting power it cannot immediately resume converting power, even if the condition which precipitated the cessation of power conversion is no longer present. For example, there could be a mandatory waiting time or start-up period after the inverter's grid connection has been restored or the inverter's input voltage has returned to within a valid operating range before the inverter can begin power conversion and draw DC power at its input. A string inverter could be unable to start operation and draw DC current until this start-up period expires. The start-up period could be on the order of five minutes. Therefore, even if a string disconnect condition such as a grid fault, inverter fault, opening of a disconnect switch, loss of panel illumination or open circuit in the string has been resolved, the inverter could be unable to draw a significant DC current until the inverter's start-up period has expired. Thus, the absence of string current might not on its own be a reliable indicator of electrical continuity. In this case, if an RSD reconnects the PV panel or panel string to the inverter input, there could be no significant string current until the inverter's start-up period expires. In addition, many inverters require a minimum value of voltage at their input before they will start operation. It could therefore be beneficial for RSD 202, for example, to reconnect panel string 260 to inverter 220 and have it remain connected even if there is no string current to give inverter 220 a sufficiently high input voltage to start.

Accordingly, embodiments herein may provide a technique to verify electrical continuity to the inverter input, which could improve the safety of a PV installation.

Figure 5:
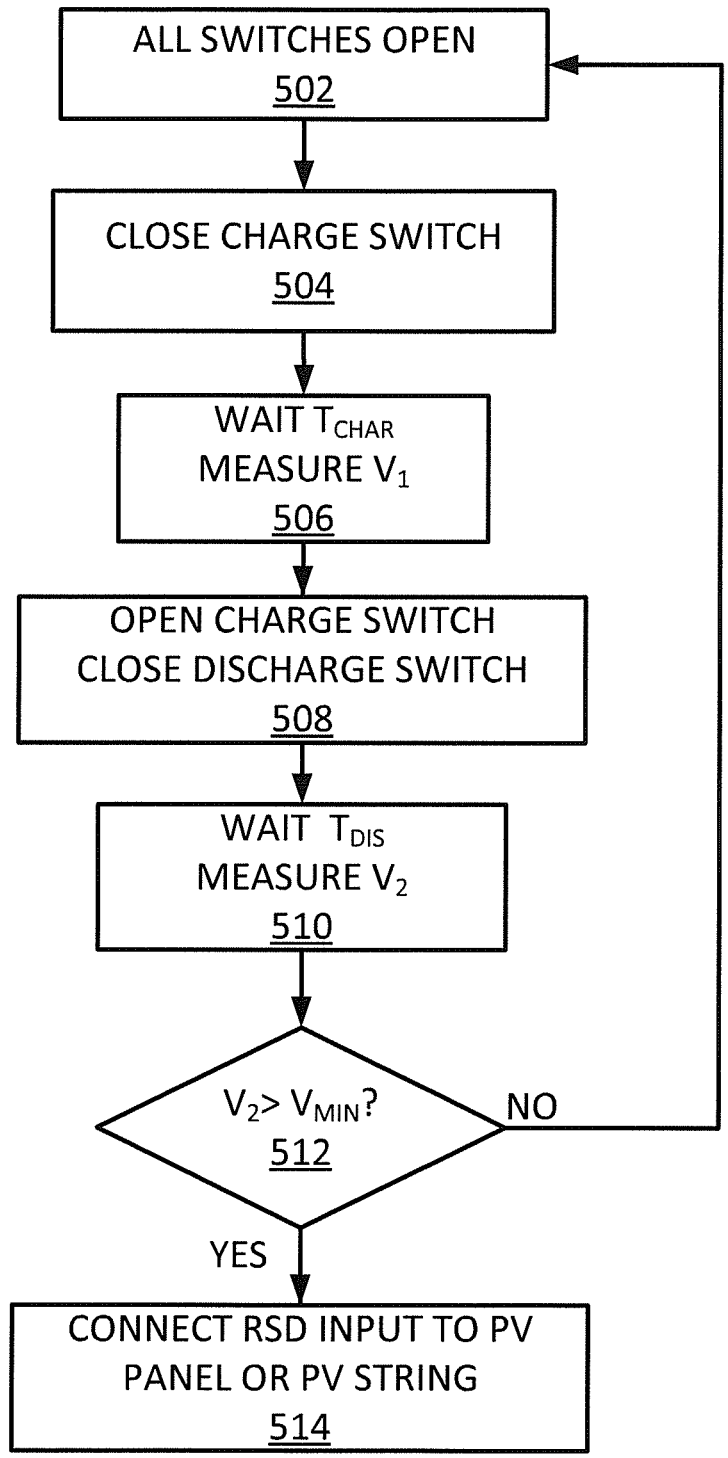
FIG. 5 is a flow diagram illustrating a method according to an embodiment herein.

FIG. 5 is a flow diagram of a method according to an embodiment, and relates to an electrical continuity verification method which could be performed by an RSD such as for example RSD 301 of FIG. 3A and/or RSD 302 of FIG. 3B.

At 502 the disconnect switches of the RSD (e.g. switch 330 of FIGS. 3A and 3B) are open and the PV panel or panel string 390 is disconnected from the rest of a PV power system. Charging switch 320 and discharge switch 350 are also open.

At 504 charge switch 320 is closed and DC test source 311 is coupled to one side of DC disconnect switch 304 through diode 321. If DC disconnect switch 304 is closed then output capacitance 356 and inverter capacitance 394 both charge to a test voltage $V_{TEST}$ that is applied by the DC test source 311. If DC disconnect switch 304 is open then only output capacitance 356 is charged.

At 506 voltage sensor 342 measures a first voltage $V_1$ after a waiting for charging time of $T_{CHAR}$. $T_{CHAR}$ is long enough to allow capacitances 356, 394 to charge to $V_{TEST}$ and in one embodiment is 100 mS. Capacitances 356, 394 need not necessarily charge all the way to $V_{TEST}$, and in some embodiments $T_{CHAR}$ could be set to a lower value. In general, the values of $V_{TEST}$ and/or $T_{CHAR}$ may be set based on values of the capacitances 359, 394 and the voltage to which the capacitances are to be charged.

At 508 charge switch 320 is opened and discharge switch 350 is closed by controller 310. If DC disconnect switch 304 is closed and there is otherwise electrical continuity in the PV power system, then capacitances 394 and 356 would have both been charged, and both discharge through discharge resistance 354. If DC disconnect switch 304 is open, then only capacitance 356 would have been charged, and only capacitance 356 discharges.

At 510, voltage sensor 342 measures a second voltage $V_2$ after waiting for discharge time $T_{DIS}$. In one embodiment $T_{DIS}$ is 50 mS. The value of $V_2$ is dependent on the state of DC disconnect switch 304. If DC disconnect switch 304 is open, then the value of $V_2$ is given by the formula:

$$V_2 = V_1 e^{-T_{DIS}/R_{DIS}C_{OUT}}$$

where $R_{DIS}$ is the resistance of discharge resistance 354 and $C_{OUT}$ is the capacitance of output capacitance 356. If DC disconnect switch 304 is closed and there is electrical continuity, then $V_2$ is given by the formula:

$$V_2 = V_1 e^{-T_{DIS}/R_{DIS}(C_{OUT}+C_{INV})}$$

where $C_{INV}$ is the capacitance of inverter capacitance 394. Comparing the above formulas for $V_2$, $V_2$ is higher after $T_{DIS}$ if there is electrical continuity to $C_{INV}$ than it would be if there is no electrical continuity to $C_{INV}$. In other words, the higher capacitance resulting from electrical continuity to the inverter at 394 takes longer to discharge than $C_{OUT}$ alone.

At 512 the value of the second voltage is compared to a minimum voltage "$V_{MIN}$". $V_{MIN}$ is of a value that is determined to be a reliable indicator of the state of disconnect switch 304, or more generally electrical continuity between the RSD 301, 302 and the inverter at 394. In one embodiment $V_{MIN}$ is 6V. In general, $V_{MIN}$ is determined based on a voltage that is higher than a voltage to which $C_{OUT}$ is expected to discharge during $T_{DIS}$ if there is no electrical continuity to the inverter at 394 and thus only $C_{OUT}$ is discharging. In an embodiment, $V_{MIN}$ could be dynamically determined based on $V_1$.

If $V_2$ is greater than $V_{MIN}$ (YES at 512) then at 514 the RSD connects its input to the PV panel 391 or panel string 390. For example, in RSD 301 of FIG. 3A disconnect switch 330 is closed by controller 310. If $V_2$ is not greater than $V_{MIN}$ (NO at 512) then the discharge switch 350 is opened and all other switches remain open at 502.

Figure 6:
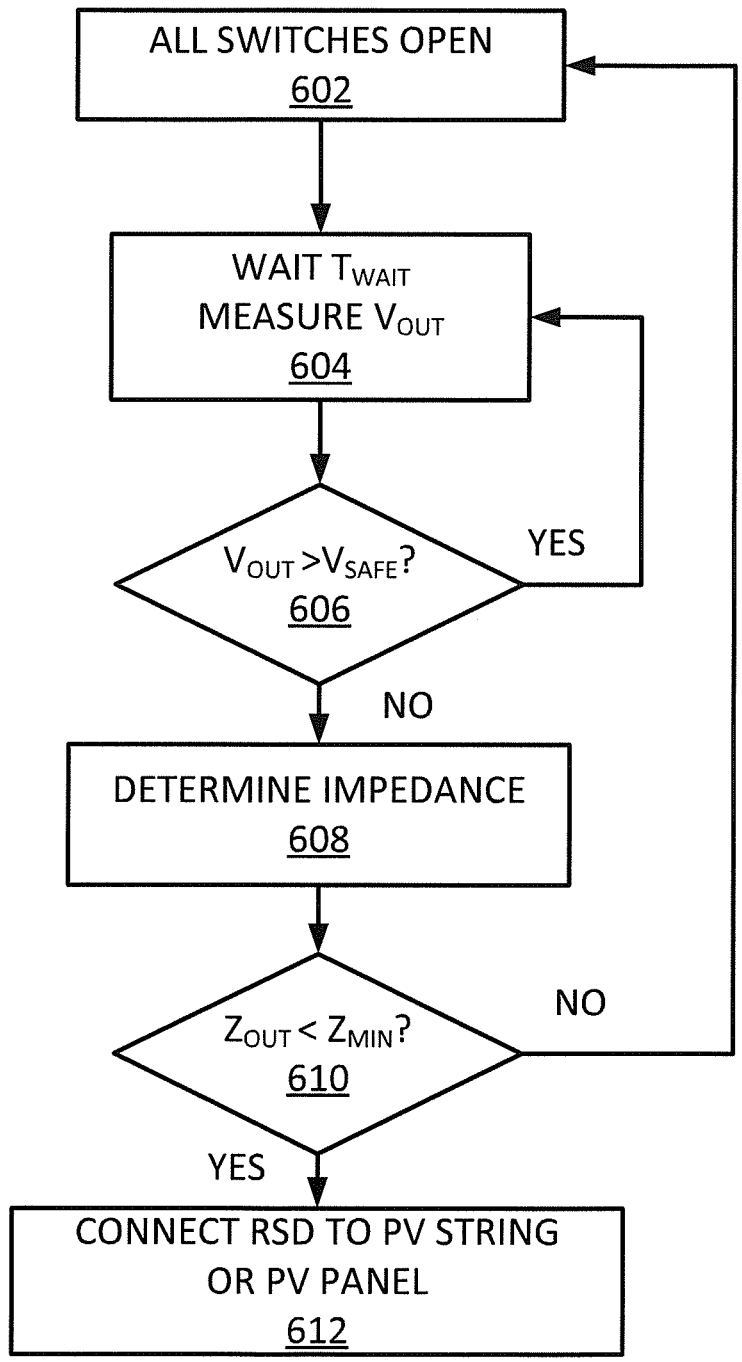
FIG. 6 is a flow diagram of method according to another embodiment.

FIG. 6 is a flow diagram of a method according to another embodiment and relates to another electrical continuity verification method, which could be performed by an RSD such as for example RSD 401 of FIG. 4.

At 602 the disconnect switch and test switch of the RSD (e.g. switches 430, 420 of FIG. 4) are open and the PV panel or panel string 409 is disconnected from the RSD. At 604 the RSD waits for a waiting period $T_{WAIT}$ and then measures the RSD output voltage $V_{OUT}$ (e.g. the voltage across terminals 482, 484 of FIG. 4). In one embodiment $T_{WAIT}$ is a time over which the voltage at the input of a string inverter is specified to reduce to substantially zero or some other predetermined level. In one embodiment $T_{WAIT}$ is 1 minute. At 606 it is determined whether $V_{OUT}$ is less than a safe voltage $V_{SAFE}$ where $V_{SAFE}$ is a residual DC inverter input voltage that could be safely applied to a test voltage source without damaging it. If $V_{OUT}$ is greater than $V_{SAFE}$ (YES at 606) then the RSD will again wait for $T_{WAIT}$ at 604 in this embodiment, although different wait times could potentially be used in subsequent wait loops.

If $V_{OUT}$ is not greater than $V_{SAFE}$ (NO at 606) then the impedance at the output of the RSD is determined at 608. For example, referring to FIG. 4, test switch 420 could close to connect AC test source 411 to output terminals 482, 484 and controller 410 could obtain measurements of voltage and/or current using sensor 442 and/or current sensor 440 and compute an impedance. Although both voltage and current could be measured and used to compute an impedance, AC test source 411 could be a voltage source with a known voltage value or a current source with a known current value, in which case only one measurement (current or voltage) could be taken and used in combination with the known value (voltage or current) for impedance computation.

A low value of impedance could indicate the presence of the inverter input capacitance (e.g. capacitance 494 of FIG. 4), that the DC disconnect switch 404 is closed, and that there is electrical continuity and it is safe to connect the PV panel or panel string 409 to the PV power system. Conversely, a high value of impedance could indicate that the DC disconnect switch 404 is open and that it is not safe to connect the PV panel or panel string 409. At 610 the computed impedance ($Z_{OUT}$) is compared to a minimum value ($Z_{MIN}$). If the impedance is less than the minimum value (YES at 610) then the inverter is determined to be present and connected, and the RSD connects the PV panel or panel string at 612. If the impedance is not less than the minimum value (NO at 610) then the process begins again at 602.

The value of $Z_{MIN}$ could be determined by the frequency (f) of AC test source 411 and the value of output capacitance 456. In one embodiment "f" is 1 kHz and $Z_{MIN}$ is 30 Ohms. The method of FIG. 6 is exemplary only and other methods are possible. For example, the RSD might determine the presence of the inverter based on a minimum current or a minimum voltage instead of a minimum impedance.

More elaborate string continuity monitoring methods are also possible. For example, it could be beneficial for an RSD to perform a minimum number of electrical continuity measurements and only couple the PV panel or panel string to the rest of a PV power system if a minimum number of consecutive measurements all indicate electrical continuity. This could prevent a single erroneous measurement causing a PV panel or panel string to be connected.

In more general terms, a method according to an embodiment involves applying a test signal from a test signal source to test electrical continuity between a PV panel disconnect switch that is open and disconnects one or more DC PV panels from a PV power system, and an inverter in the PV power system. This is shown at 504 in FIG. 5 and noted above as being part of 608 in FIG. 6. Measurements of an electrical parameter, at a shutdown device that includes the PV panel disconnect switch, are obtained after the test signal is applied, as shown at 506, 510 in FIG. 5 noted above as being part of 608 in FIG. 6. A state of electrical continuity between the PV panel disconnect switch and the inverter is determined based on the measurements.

In FIG. 5, the applying at 504 involves applying a DC signal as the test signal, and the obtaining at 506, 510 involves obtaining measurements of voltage, across output terminals at which the shutdown device is coupled to the PV power system, at respective different times after the test signal is applied. The continuity state determination at 512 in FIG. 5 is based on the voltage measurements.

The applying in 608 of FIG. 6 involves applying an AC signal as the test signal. The obtaining in 608 of FIG. 6 involves obtaining measurements of one or both of: voltage, across output terminals at which the shutdown device is coupled to the PV power system, and current flow in a circuit path between the output terminals, while the test signal is applied. As noted above, voltage or current could be otherwise obtained, such as where the test signal is supplied by a test signal source having a known voltage value or a known current value. The state determination is shown in FIG. 6 at 610, and involves determining the state of electrical continuity based on an impedance determined at 608 from the voltage and the current.

Figure 7:
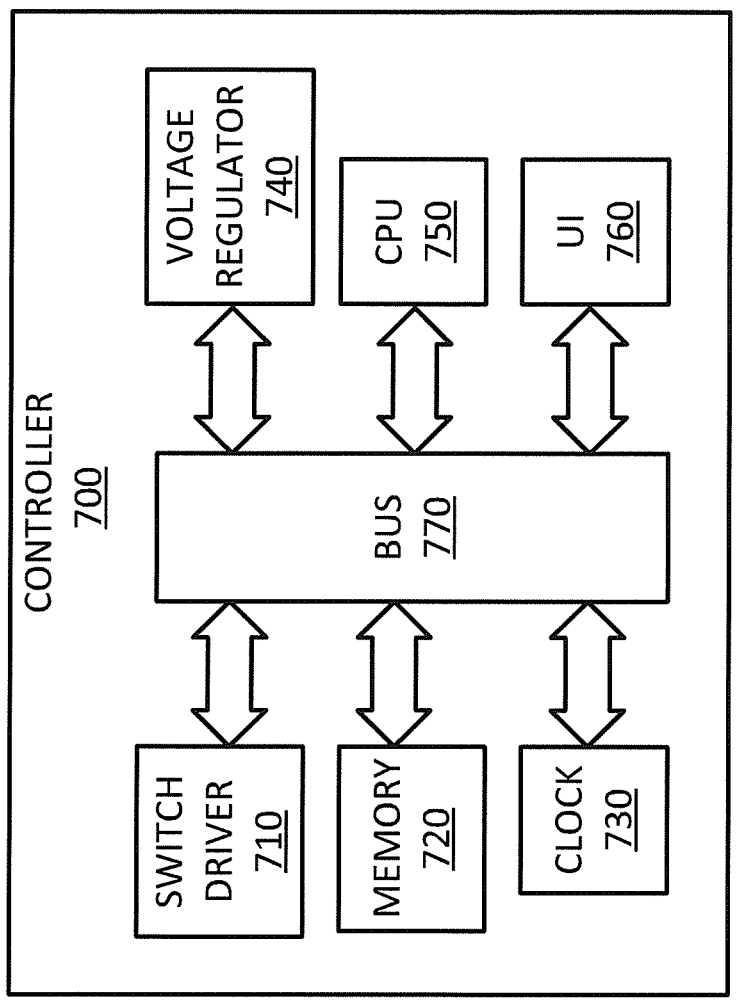
FIG. 7 is a block diagram of one embodiment of an RSD controller.

FIG. 7 is a block diagram of one embodiment of a RSD controller 700. Controller 700 could be used for controller 310, 410 in accordance with the embodiments herein. Controller 700 comprises switch driver 710, memory 720, clock 730, voltage regulator 740, central processing unit (CPU) 750, user interface (UI) 760, and control and data bus 770. Voltage regulator 740 converts the PV panel or panel string output voltage to a constant controller supply voltage in an embodiment. Switch driver 710 supplies switch drive signals to switches 330, 320, 350, 430, 420 to control their respective opening and closing. Firmware for the operation of the controller 700 is stored in memory 720. In one embodiment, memory 720 comprises non-volatile memory such as Flash, Electrically Erasable Programmable Read Only Memory (EEPROM), EPROM, ROM, etc. The firmware is executed on CPU 750. Clock 730 controls the internal timing of the operation of the controller 700. UI 760 could include one or more devices to provide outputs to a user and/or accept inputs from a user, such as to indicate the status of an RSD to a user. Control and data bus 770 interconnects these components of the controller 700 with each other as shown, in one embodiment herein.

What has been described is merely illustrative of the application of principles of embodiments of the present disclosure. Other arrangements and methods can be implemented by those skilled in the art.

Any divisions of function in the drawings are not intended to be limiting or exhaustive. Other embodiments could include additional, fewer, and/or different components than shown. Similarly, other method embodiments could include additional, fewer, and/or different operations performed in an order similar to or different from the orders shown in the drawings and described above.

For example, RSDs 301, 302, 401 of FIGS. 3A, 3B, and 4 are examples only and other embodiments of an RSD are also possible. In another embodiment of RSDs 301, 302 for instance, a resistor is connected in a circuit path with DC test source 311 to limit the charging current when charge switch 320 is closed and inverter capacitance 394 is charging. In one embodiment the value of this resistance is 100 Ohms.

In another embodiment to limit the charging current, the charging current is limited by gradually increasing the duty cycle of charging switch 320. For example, charging switch 320 could be switched to repetitively close and open with a period of $T_{SW}$, a switch ON time of $T_{PULSE}$ and a duty cycle of D. The duty cycle is the ratio of $T_{PULSE}/T_{SW}$. The duty cycle could then be gradually increased to control current through the charging switch 320. In one example embodiment, the duty cycle is increased from 0 to 100% over 50 milli-seconds.

Although described primarily in the context of methods and apparatus, other implementations are also contemplated, as instructions stored on a non-transitory computer-readable medium, for example.

What is claimed is:

1. Apparatus comprising:
a photovoltaic (PV) panel disconnect switch to switchably couple one or more Direct Current (DC) PV panels to a PV power system;
continuity testing circuitry, operatively coupled to the PV panel disconnect switch and to the PV power system, to enable testing of electrical continuity between the PV panel disconnect switch and an inverter in the PV power system;
a controller, operatively coupled to the PV panel disconnect switch and to the continuity testing circuitry, to control the PV panel disconnect switch to open responsive to occurrence of a disconnect condition, to control the continuity testing circuitry to test electrical continuity between the PV panel disconnect switch and the inverter with the PV panel disconnect switch open, to maintain the PV panel disconnect switch open on determining no electrical continuity, and to control the PV panel disconnect switch to close on determining that there is electrical continuity between the PV panel disconnect switch and the inverter.

2. The apparatus of claim 1, wherein the PV panel disconnect switch is coupled to a single DC PV panel in a PV panel array, and wherein the apparatus is located less than 10 feet from the PV panel array.

3. The apparatus of claim 1, wherein the PV panel disconnect switch is coupled to a panel string comprising a plurality of serially connected DC PV panels in a PV panel array, and wherein the apparatus is located less than 10 feet from the PV panel array.

4. The apparatus of claim 1, wherein the controller is coupled to control the continuity testing circuitry to test electrical continuity within a maximum of 30V and 240VA.

5. Apparatus comprising:
a photovoltaic (PV) panel disconnect switch to switchably couple one or more Direct Current (DC) PV panels to a PV power system;
continuity testing circuitry, operatively coupled to the PV panel disconnect switch and to the PV power system, to enable testing of electrical continuity between the PV panel disconnect switch and an inverter in the PV power system, the continuity testing circuitry comprising a test signal source;
a controller, operatively coupled to the PV panel disconnect switch and to the continuity testing circuitry, to control the continuity testing circuitry to apply a test signal from the test signal source to the PV power system with the PV panel disconnect switch open, and to determine a state of electrical continuity between the PV panel disconnect switch and the inverter based on measurements of an electrical parameter in the continuity testing circuitry after the test signal is applied.

6. The apparatus of claim 5, wherein the controller is further operable to maintain the PV panel disconnect switch open on determining no electrical continuity, and to control the PV panel disconnect switch to close on determining that there is electrical continuity between the PV panel disconnect switch and the inverter.

7. The apparatus of claim 5,
wherein the apparatus comprises output terminals to couple the apparatus to the PV power system,
wherein the test signal source comprises a DC test signal source,
wherein the continuity testing circuitry comprises: output capacitance coupled across the output terminals, the DC test signal source and a charging switch coupled in a first circuit path across the output terminals, and a discharge resistance and a discharge switch coupled in a second circuit path across the output terminals.

8. The apparatus of claim 7, wherein the continuity testing circuitry further comprises a diode coupled across the output capacitance.

9. The apparatus of claim 5,
wherein the apparatus comprises output terminals to couple the apparatus to the PV power system,
wherein the test signal source comprises an Alternating Current (AC) test signal source,
wherein the continuity testing circuitry comprises: output capacitance coupled across the output terminals, the AC test signal source and a test switch coupled in a circuit path across the output terminals, and a discharge resistance coupled across the output terminals.

10. The apparatus of claim 5, wherein the electrical parameter comprises one or both of:
voltage and current.

11. The apparatus of claim 5, wherein the test signal has a voltage lower than a predetermined maximum voltage that is compliant with a safety standard.

12. The apparatus of claim 5, wherein the test signal is within a maximum of 30V and 240VA.

13. The apparatus of claim 5, wherein the test signal source is powered by the one or more DC PV panels while the disconnect switch is open.

14. The apparatus of claim 5, wherein the PV panel disconnect switch is coupled to a single DC PV panel in a PV panel array, and wherein the apparatus is located less than 10 feet from the PV panel array.

15. The apparatus of claim 5, wherein the PV panel disconnect switch is coupled to a panel string comprising a plurality of serially connected DC PV panels in a PV panel array, and wherein the apparatus is located less than 10 feet from the PV panel array.

16. The apparatus of claim 7, wherein the controller is operable to determine the state of electrical continuity between the PV panel disconnect switch and the inverter based on measurements of voltage across the output terminals at respective different times after the test signal is applied.

17. The apparatus of claim 9, wherein the controller is operable to determine the state of electrical continuity between the PV panel disconnect switch and the inverter based on an impedance determined from voltage across the output terminals and current flow in a circuit path between the output terminals while the test signal is applied.

18. A method comprising:
applying a test signal from a test signal source to test electrical continuity between a PV panel disconnect switch that is open and disconnects one or more Direct Current (DC) PV panels from a PV power system, and an inverter in the PV power system;
obtaining measurements of an electrical parameter, at a shutdown device that comprises the PV panel disconnect switch, after the test signal is applied;
determining a state of electrical continuity between the PV panel disconnect switch and the inverter based on the measurements.

19. The method of claim 18,
wherein the applying comprises applying a DC signal as the test signal,
wherein the obtaining comprises obtaining measurements of voltage, across output terminals at which the shutdown device is coupled to the PV power system, at respective different times after the test signal is applied.

20. The method of claim 18,
wherein the applying comprises applying an Alternating Current (AC) signal as the test signal,
wherein the obtaining comprises obtaining measurements of one or both of: voltage, across output terminals at which the shutdown device is coupled to the PV power system, and current flow in a circuit path between the output terminals, while the test signal is applied,
wherein the determining comprises determining the state of electrical continuity between the PV panel disconnect switch and the inverter based on an impedance determined from the voltage and the current.

* * * * *